US008884846B2

United States Patent
Tanaka et al.

(10) Patent No.: US 8,884,846 B2
(45) Date of Patent: Nov. 11, 2014

(54) ORGANIC EL DISPLAY DEVICE

(75) Inventors: Masahiro Tanaka, Chiba (JP); Jun Tanaka, Kawasaki (JP); Nobuhiko Fukuoka, Ebina (JP); Hitoshi Azuma, Yokohama (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 518 days.

(21) Appl. No.: 12/515,549

(22) PCT Filed: Feb. 22, 2008

(86) PCT No.: PCT/JP2008/053042
§ 371 (c)(1),
(2), (4) Date: May 20, 2009

(87) PCT Pub. No.: WO2008/105336
PCT Pub. Date: Sep. 4, 2008

(65) Prior Publication Data
US 2010/0013740 A1    Jan. 21, 2010

(30) Foreign Application Priority Data
Feb. 28, 2007    (JP) ................................. 2007-049315

(51) Int. Cl.
G09G 3/00    (2006.01)
G09G 3/36    (2006.01)
H01J 63/04    (2006.01)
H01J 9/04    (2006.01)
H01L 51/52   (2006.01)

(52) U.S. Cl.
CPC ......... *H01L 51/5237* (2013.01); *H01L 51/5281* (2013.01)
USPC .................. 345/32; 345/92; 313/504; 445/50

(58) Field of Classification Search
USPC ....................... 345/31–36; 313/504
See application file for complete search history.

(56) References Cited

U.S. PATENT DOCUMENTS 6,081,071 A  *  6/2000  Rogers ........................... 313/512
6,833,668 B1    12/2004  Yamada et al.
(Continued)

FOREIGN PATENT DOCUMENTS

JP    2000-173766    6/2000
JP    2001-102167    4/2001
(Continued)

*Primary Examiner* — Alexander Eisen
*Assistant Examiner* — Amit Chatly
(74) *Attorney, Agent, or Firm* — Antonelli, Terry, Stout & Kraus, LLP.

(57) ABSTRACT

A transparent drying material is applied on an inner side of a translucent glass substrate, which is arranged to face a sealing glass substrate whereupon an organic light emitting element is formed, and the sealing glass substrate and the translucent glass substrate are sealed. A polarizing film is arranged on an outer side of the transparent glass substrate. Luminance non-uniformity on a screen is eliminated by permitting an angle formed by a normal line on the surface unevenness of the transparent drying material and a normal line of the translucent glass substrate to be 53 degrees or less.

16 Claims, 5 Drawing Sheets

(56) References Cited

U.S. PATENT DOCUMENTS

| | | |
|---|---|---|
| 7,112,115 B1 | 9/2006 | Yamazaki et al. |
| 2002/0057565 A1* | 5/2002 | Seo .................................. 362/84 |
| 2003/0110981 A1 | 6/2003 | Tsuruoka et al. |
| 2004/0092197 A1* | 5/2004 | Wei et al. .......................... 445/50 |
| 2004/0189191 A1* | 9/2004 | Ohshita et al. ................. 313/504 |
| 2005/0110402 A1 | 5/2005 | Tanaka |
| 2005/0140265 A1* | 6/2005 | Hirakata ....................... 313/483 |
| 2005/0269948 A1* | 12/2005 | Tanaka ......................... 313/504 |
| 2005/0275348 A1* | 12/2005 | Choi et al. .................... 313/512 |
| 2007/0001591 A1* | 1/2007 | Tanaka ......................... 313/504 |
| 2007/0018566 A1* | 1/2007 | Yamazaki et al. ............. 313/498 |
| 2007/0290609 A1* | 12/2007 | Ishii et al. ..................... 313/504 |

FOREIGN PATENT DOCUMENTS

| | | |
|---|---|---|
| JP | 2001-203076 | 7/2001 |
| JP | 2001-345175 | 12/2001 |
| JP | 2003-144830 | 5/2003 |
| JP | 2003-338366 | 11/2003 |
| JP | 2003338366 A * | 11/2003 |
| JP | 2004-079208 | 3/2004 |
| JP | 2004-327195 | 11/2004 |
| JP | 2004-348971 | 12/2004 |
| JP | 2005-150100 | 6/2005 |
| JP | 2007-027142 | 2/2007 |
| JP | 2007-042612 | 2/2007 |

* cited by examiner

ORGANIC EL DISPLAY DEVICE

TECHNICAL FIELD

The present invention relates to an organic EL display device using an organic light emitting element and, in particular, to a top emission organic EL display device in which a transparent drying material with moisture absorption is deposited on the inner surface of sealing substrate for shielding the organic EL display device from external atmosphere, specifically to a film structure of the transparent drying material.

BACKGROUND ART

There has been known a structure using an electroluminescence (EL) element or an injection light-emitting diode in a current controlled light-emitting device used in a display device. Among other things, a current controlled EL (or a charge-injection EL, hereinafter referred to as organic light emitting element or organic EL) which uses an organic luminescence material as a light emitting layer is drawing attention as a display device which is high in luminance, large in size, low in manufacturing cost and capable of displaying full color images.

FIG. 7 is an enlarged schematic cross section of a principal part of a structural example of an organic light emitting element. For the sake of simplicity of description, FIG. 7 illustrates only a single pixel. The organic light emitting element ELD is provided with an anode AD formed of a transparent conductive thin film such as ITO on the inner face of a translucent glass substrate SUB and is configured such that a hole transport layer HTL and a luminescence layer LUL which are formed of thin film of an organic material and a cathode KD as a light emitting control electrode are sequentially stacked on the anode AD.

In the organic light emitting element ELD thus configured, a predetermined voltage is applied between the cathode KD and the anode AD to transport holes from the hole transport layer HTL to the luminescence layer LUL, causing the luminescence layer LUL to emit light, thereby emission light L is emitted from the glass substrate SUB. The above configuration is of a bottom emission type. For a top emission type, the emission light L is emitted to the side opposite to the glass substrate SUB.

FIG. 8 is an enlarged schematic cross section of a principal part of another structural example of an organic light emitting element. The organic light emitting element ELD is provided with an anode AD formed of a transparent conductive film (thin film) such as ITO on the inner face of a translucent glass substrate SUB which is the same as the above substrate, and is configured such that a hole transport layer HTL, a luminescence layer LUL and an electron injection layer EIL which are formed of a thin film of an organic material and a cathode KD are sequentially stacked on the anode AD.

In the organic light emitting element ELD thus configured, a predetermined voltage is applied between the cathode KD and the anode AD to transport holes from the hole transport layer HTL to the luminescence layer LUL and inject electrons from the electron injection layer EIL, causing the luminescence layer LUL to emit light, thereby emission light L is emitted from the glass substrate SUB.

The organic light emitting element ELD with the above stack configuration is provided with the hole transport layer HTL for injecting holes on the anode AD side and the electron injection layer EIL for injecting electrons on the cathode KD side to improve a light emitting efficiency.

FIG. 9 is a schematic cross section of a principal part of a conventional structural example of a top emission organic EL display device using the organic light emitting element ELD of this type. For the sake of simplicity of description, FIG. 9 illustrates only a single pixel to omit a switching element for selecting the pixel and a control element for controlling emission luminance.

As illustrated in FIG. 9, the organic EL display device using the organic light emitting element ELD is configured such that a sealing glass substrate SUB1 on the main surface of which the organic light emitting element ELD is formed is opposed to a translucent glass substrate SUB2 for protecting the organic light emitting element ELD and a sealing material SEA is applied to the periphery of both substrates and cured to bond both substrates together to isolate the inside from the outside, sealing the inside.

In general, a transparent drying material DES for controlling the degradation of the organic light emitting element ELD mainly due to humidity is fixed to the inner surface of the translucent glass substrate SUB2 (the surface opposing the main surface of the sealing glass substrate SUB1). The transparent drying material DES may be fixed by other methods: for example, a recess is formed in the inner surface of the translucent glass substrate SUB2 to bond the transparent drying material DES to the recess using an adhesive; or a glass cap GCP to which the transparent drying material DES is applied is bonded to the recess of the glass substrate. For the related art of the type described above, the following patent document 1 can be cited, for example.

Patent Document 1: Japanese Patent Application Laid-Open No. 2001-345175

DISCLOSURE OF THE INVENTION

Problems to be Solved by the Invention

In the thus configured top emission organic EL display device, a light emitting material for the organic light emitting element ELD is deteriorated by absorbing moisture in air and other gas compositions such as oxygen when the organic light emitting element ELD is produced, so that the transparent drying material DES is generally mounted to perform dehumidification inside the organic light emitting element ELD in production.

The transparent drying material DES needs to capture moisture permeating the sealing material SEA and entering the space to keep drying condition during the whole lifetime of the organic light emitting element ELD. For this reason, the transparent drying material DES needs to have a capacity of capturing moisture exceeding the permeation amount, which is determined by a material of the sealing material SEA, a length of a sealing portion and a seal width. The absolute amount of the transparent drying material DES can be calculated by the permeation amount and the thickness thereof can be determined by an application area. Consequently, it is determined based on absorbance and thickness whether the transparent drying material DES is suitable for a sealing material for the top emission organic EL display device.

The top emission organic EL display device is a device in which a displayed image of the organic light emitting element ELD is viewed through the transparent drying material DES. For this reason, there is a problem in that the low light transmittance of the transparent drying material DES darkens the image and the low surface flatness thereof distorts or disturbs the image due to a lens effect. These phenomena become particularly noticeable as the screen size is increased.

The present invention has been made to solve the foregoing existing problems and its object is to provide a top emission organic EL display device in which the surface of a transparent drying material is flattened to minimize the distortion and the disturbance of an image, enabling a sharp image to be provided.

Means for Solving the Problems

To achieve the above object, the organic EL display device according to the present invention is configured such that plural organic light emitting elements are arranged on the main surface of a sealing substrate which is hermetically sealed in such a manner that a sealing material is caused to oppose a translucent substrate and interposed at the peripheral portion of the translucent substrate and between the translucent and sealing substrates, and a transparent drying material is deposited on the inner surface of the translucent substrate opposing the plural organic light emitting elements. The surface roughness of the transparent drying material is reduced such that an angle formed by a normal line on the translucent substrate and a normal line on the surface of the transparent drying material is 53 degrees or less, thereby the distortion and the disturbance of an image can be absorbed to solve the problem described in the related art.

The present invention is not limited to the above configuration and the configurations described in the embodiment mentioned below, and it is to be understood that various changes may be made without departing from the technical concept of the present invention.

Effect of the Invention

According to the organic EL display device of the present invention, the surface roughness of the transparent drying material is reduced such that an angle formed by a normal line on the translucent substrate and a normal line on the surface of the transparent drying material is 53 degrees or less, thereby the distortion and the disturbance of an image resulting from the surface roughness of the transparent drying material are absorbed to provide a great effect of obtaining a sharp image.

According to the present invention, it is possible to obtain a great effect such as easy realization of sealing the top emission organic EL display device using the transparent drying material.

According to the present invention, the organic EL display device with a flat-plate sealing structure can be produced to make the cost lower than an organic EL display device with a structure using an engraved glass cap. The top emission organic EL display device is more similar to the bottom emission organic EL display device in the method of producing the display device than an organic EL display device with a solid sealing structure, which provides a great effect that there is little need for changing production facilities.

BEST MODE FOR CARRYING OUT THE INVENTION

The specific embodiment of the present invention is described in detail below with reference to drawings of the embodiment.

First Embodiment

FIG. 1 is a schematic cross section of a principal part of an organic EL display device according to an embodiment of the present invention. The same portions as those in the foregoing figures are denoted by the same reference letters to omit description thereof. In FIG. 1, an organic EL display device ELDD is formed of the flat-plate sealing glass substrate SUB1 and the translucent glass substrate SUB2 which are arranged in parallel and in opposition to each other and overlapped each other, the plural organic light emitting elements ELD in which the anode AD, the hole transport layer HTL, the luminescence layer LUL, the electron injection layer EIL and the cathode KD, for example, are sequentially stacked on the sealing glass substrate SUB1, the transparent drying material DES deposited on the inner surface of the translucent glass substrate SUB2, and the sealing material SEA which adhesively fixes the outermost periphery of both substrates so as to surround the periphery of the plural organic light emitting elements ELD. Furthermore, a polarizing film POL is stuck on the translucent glass substrate SUB2. The existence of the polarizing film POL eliminates luminance nonuniformity caused by reflected light even if there is unevenness to be described later on the transparent drying material DES when the screen is viewed from the top of the translucent glass substrate SUB2.

The organic EL display device is configured such that a frame FRM is formed of epoxy resin in a bank shape at the inner periphery of display area of the translucent glass substrate SUB2, the transparent drying material DES is applied to the inside of frame FRM after the epoxy resin has solidified, an ultraviolet hardening sealing material SEA is applied to the outermost periphery of the translucent glass substrate SUB2 after the transparent drying material DES has dried, the sealing glass substrate SUB1 on the inner surface of which the plural organic light emitting elements ELD are formed is superposed on the sealing material SEA, and the sealing material SEA of the periphery is irradiated with ultraviolet rays to be cured by heating. Incidentally, the existence of the bank-shaped frame FRM in the display area does not cause luminance nonuniformity, thanks to the effect of the polarizing film described above.

The transparent drying material DES formed on the translucent glass substrate SUB2 is formed in such a manner that a transparent drying material solution with a viscosity of approximately 18 cp in which alcoholate or silica gel is dissolved in a solvent is applied to the inner surface of the translucent glass substrate SUB2 by a dispenser method, spread by a squeegee in one direction, and left as it is at a temperature of approximately 150° C. for 10 minutes to be dried, thereby the surface is flattened. Incidentally, the transparent drying material solution to be used may be 15 cp to 40 cp in viscosity.

The produced sealing material SEA was approximately 40 μm in thickness and approximately 2 mm in width. The sealing material SEA was approximately 10 g/m$^2$·24 hr (approximately 10 μm in thickness) in moisture permeability. The moisture permeability in this case was approximately 0.28 μg/24 hr. An approximately 1-mg moisture absorbing amount of the transparent drying material DES is required to keep dry the inside of the sealing glass substrate SUB1 and the translucent glass substrate SUB2 for approximately ten years. The transparent drying material DES is approximately 20 μm in average thickness, approximately 35 μm in maximum thickness and approximately 10 μm in minimum thickness and absorbs approximately 2-mg moisture, which is sufficient as the amount of the transparent drying material DES.

When the transparent drying material DES is approximately 20 μm in thickness with refractive index as approximately 1.5, an optical interference fringe is nearly equal to 0.1 mm of human eye resolution, so that it is required to make the thickness greater. From the viewpoint of moisture absorption power, assuming that the sealing material SEA applied to the outermost periphery is approximately 1.5 mm in width and approximately 30 μm in thickness and a display panel is approximately 50 mm on the diagonal, the moisture absorption power of the sealing material SEA is on the order of 10 g/m$^2$·24 hr (approximately 10 μm in thickness), so that the moisture permeability per day is approximately 0.2 μg/24 hr, which adds up to approximately 0.73 mg in 10 years. The transparent drying material DES enabling absorbing the this amount of moisture is required. Therefore, the transparent drying material DES being approximately 20 μm in thickness allows absorbing approximately 2-mg moisture. If the sealing material SEA is 30 μm in thickness, the sealing material is in partial contact with the organic EL element due to nonuniformity in thickness of the transparent drying material DES.

For surface flatness of the transparent drying material DES, as long as the surface the transparent drying material DES is a smooth curve in the structure that the surface the transparent drying material DES is very close to a pixel (or several tens of micrometers away from a pixel), an image does not look distorted. In other words, the image is not distorted by lens effect due to dispersion in thickness of the transparent drying material. There must not exist any flaw, foreign matter or step on the surface of the transparent drying material DES. However, if the surface is such a curved surface that the quadratic differential is continuous, no problem is anticipated with the distortion of the image.

In the top emission organic EL display device thus configured, an image is viewed through the transparent drying material DES, so that an optical problem was studied. As a result, it can be seen from an enlarged cross section in FIG. 2 that the surface roughness (unevenness) UNE of the transparent drying material DES was gentle and an angle θ formed by a normal line of the translucent glass substrate SUB2 and a normal line of the surface of the transparent drying material DES was approximately 10 degrees or less. Further, no problem occurred with respect to distortion in an image.

Since the transparent drying material DES is only several tens of micrometers away from the organic light emitting element ELD, the amount of distortion caused by lens effect due to nonuniformity in thickness of the transparent drying material DES is approximately 7 μm or less and cannot be recognized by naked eyes when the angle is approximately 10 degrees at maximum and a distance is approximately 40 μm at maximum between the light emission surface of the organic light emitting element ELD and the surface of the transparent drying material DES. For an interference color, if the thickness is approximately 20 μm, the distance between fringes produced by a difference between optical angles at which light enters pupils is approximately 100 μm or less, which cannot be recognized. The light transmittance of the transparent drying material DES is approximately 95% and luminance nonuniformity is not caused.

FIG. 3 is a chart illustrating a relationship between an angle θ formed by a normal line of the translucent glass substrate SUV2 and a normal line of the surface of the transparent drying material DES in FIG. 2 and reflectivity. As is clear from FIG. 3, the reflectivity is approximately 10% or less at angles of from 0 degree to 53 degrees, which means very little. The luminance nonuniformity is not caused in this range. The term "reflectivity" shown in FIG. 3 refers to the amount in which light incident from the sealing glass substrate SUB1 in FIG. 1 is reflected again by the sealing glass substrate SUB1.

When an incident angle is approximately 53 degrees or more due to surface reflection of the transparent drying material DES, a transmitted light amount is reduced by approximately 2% or more, so that an angle of the surface of the transparent drying material DES to the light emission surface needs to be approximately 53 degrees or less. Incidentally, even if light is perpendicularly incident on the transparent drying material DES, transmittance is approximately 92% due to difference between refractive indexes. This means that decrease in a transmitted light amount by 2% or more lowers the transmitted light amount to 90% or less. For reflection of external light, corrugation on the surface of the transparent drying material DES varies the reflection direction, so that the surface unevenness of the transparent drying material DES is seen. The unevenness can be easily absorbed by sticking a protective film, a polarizing film, a color film or a color filter, for example, on the surface of the translucent glass substrate SUV2, which can make it hard to see the surface roughness of the transparent drying material DES. Among other things, the polarizing film is more effective than any other material.

According to such a configuration, the organic EL display device with a flat-plate sealing structure can be produced to eliminate the need for using an engraved glass cap, enabling a panel to be made thinner than an existing one, which allows the organic EL display device to be thinned and the cost to be reduced.

FIG. 4 is a circuit diagram illustrating an example of configuration of a pixel in the top emission organic EL display device to which the present invention is applied. A pixel PX is a sub-pixel in color display. The pixel is formed of a thin film switching transistor TFT1 connected to a scanning line GL and a data line DL, a storage capacity CPR for storing display data supplied from the data line DL as an electric charge when the thin film switching transistor TFT1 selected by the scanning line GL is turned on, a thin film transistor TFT2 for driving an organic light emitting element 15 and a current supplying line CSL.

The gate electrode of the thin film transistor TFT1 is connected to the scanning line GL and the drain electrode thereof is connected to the data line DL. The gate electrode of the thin film transistor TFT2 is connected to the source electrode of the thin film transistor TFT1 and this node is connected to one electrode (positive electrode) of the storage capacity CPR. The drain electrode of the thin film transistor TFT2 is connected to the current supplying line CSL and the source electrode thereof is connected to the anode 14 of the organic light emitting element 15.

When the pixel PX is selected by the scanning line GL to turn on the thin film transistor TFT1, display data supplied from the data line DL is stored in the storage capacity CPR. When the thin film transistor TFT1 is turned off, the thin film transistor TFT2 is turned on to cause current to flow from the current supplying line CSL to the organic light emitting element 15 and to continue flowing during approximately one frame period (or one field period). The current flowing at that point is defined by a charge corresponding to the data signal stored in the storage capacity CPR. The circuit is the simplest in configuration and other various circuit configurations are known.

FIG. 5 is a top plan view illustrating the vicinity of a pixel in an example of the pixel circuit in FIG. 4 realized on a substrate. In the figure, the same reference letters as those in FIG. 4 correspond to the same parts in FIG. 4. DE denotes an opening for the pixel. The thin film transistors TFT1 and TFT2 are arranged at a non-display portion adjacent to the opening DE for the pixel.

FIG. 6 is an equivalent circuit including a driving circuit of the organic EL display device. The pixels PX are arranged in a matrix shape to form an display area AR. The data line GL is driven by a data line driving circuit DDR. The scanning line GL is driven by a scanning line driving circuit GDR. The current supplying line CSL is connected to a current supplying circuit (not shown) through a current supplying bus line CSLB. TM denotes an external input terminal.

DESCRIPTION OF REFERENCE NUMERALS

Figure 1:
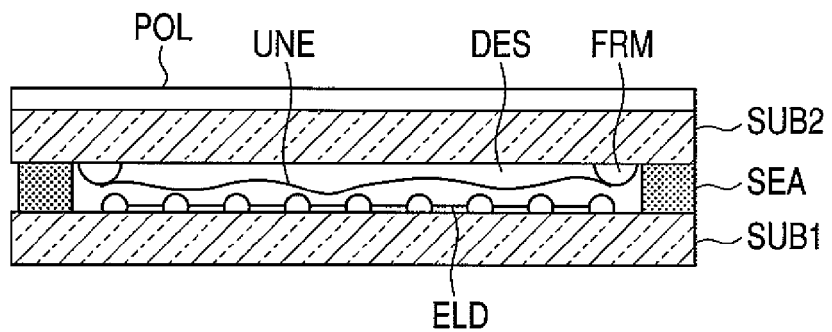
FIG. 1 A schematic cross section of a principal part of an organic EL display device according to an embodiment of the present invention.
Figure 2:
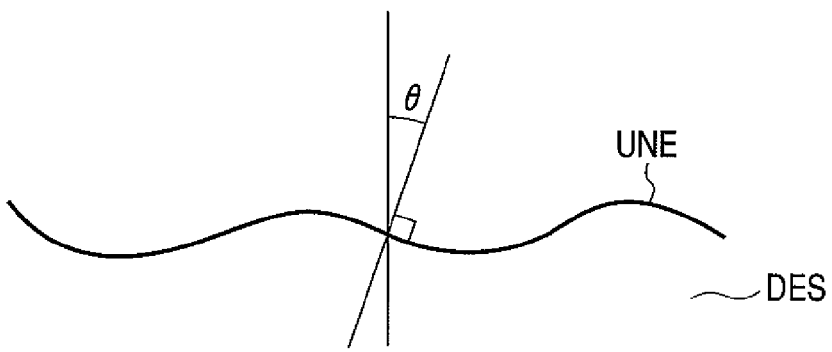
FIG. 2 An enlarged cross section illustrating the surface roughness of a transparent drying material.
Figure 3:
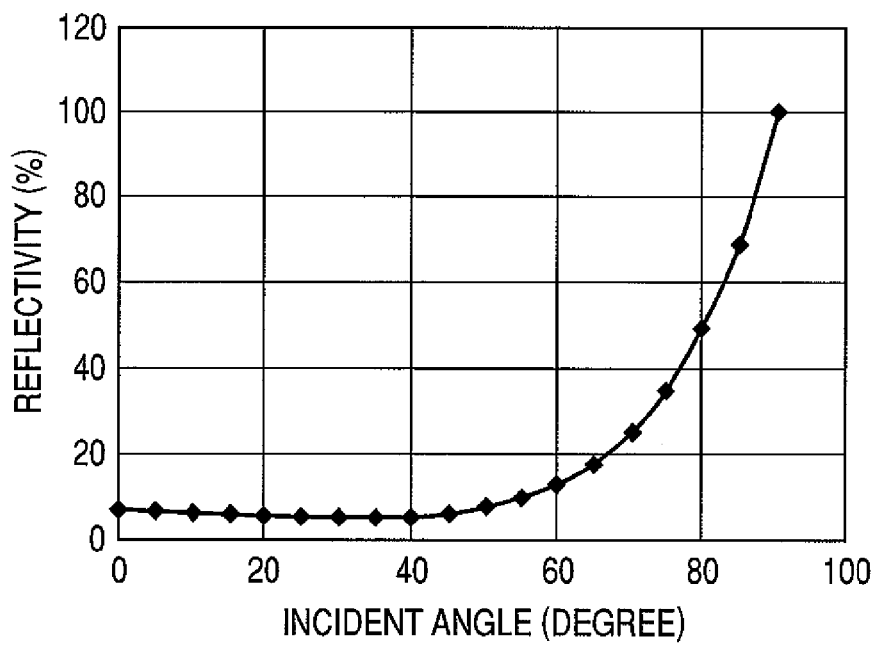
FIG. 3 A chart illustrating a relationship between an angle θ formed by a normal line of a translucent glass substrate and a normal line of the surface of a transparent drying material and reflectivity.
Figure 4:
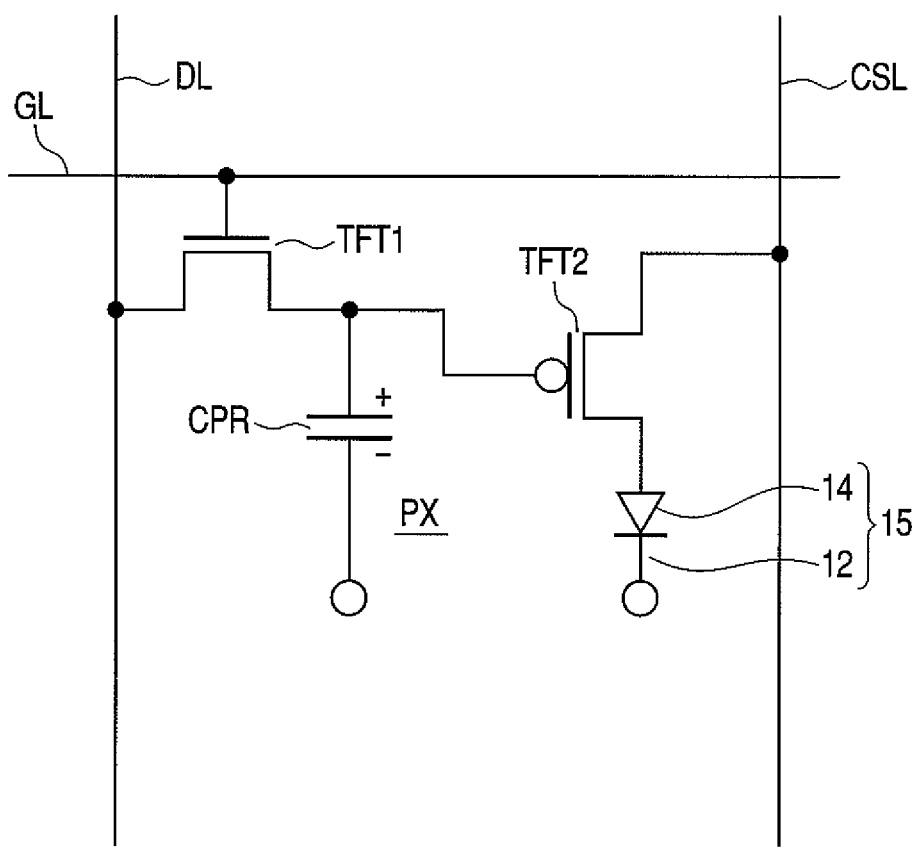
FIG. 4 A circuit diagram illustrating a configuration in the vicinity of one organic EL light emitting element, i.e., one pixel in the top emission organic EL display device to which the present invention is applied.
Figure 5:
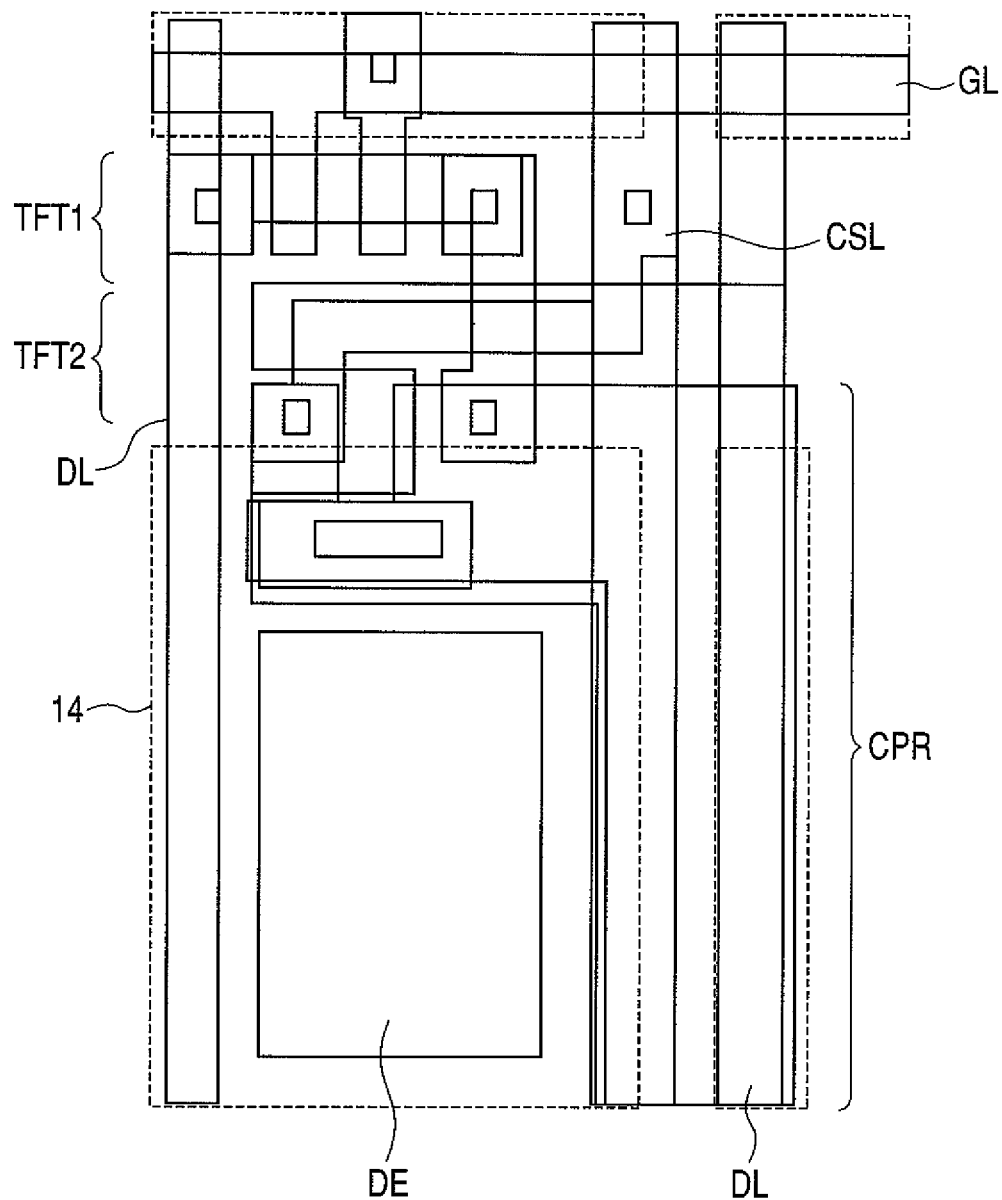
FIG. 5 A top plan view illustrating the vicinity of a pixel in an example of the pixel in FIG. 4 realized on a substrate.
Figure 6:
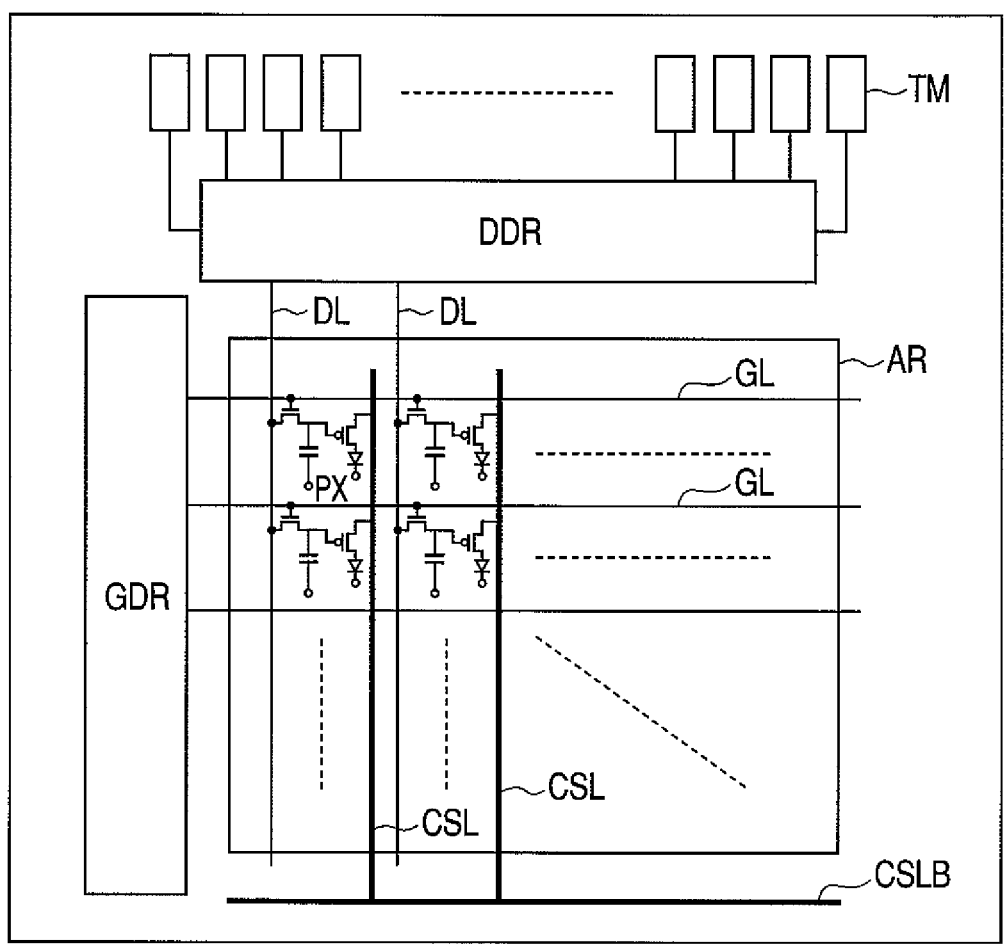
FIG. 6 An equivalent circuit including a driving circuit of the organic EL display device.
Figure 7:
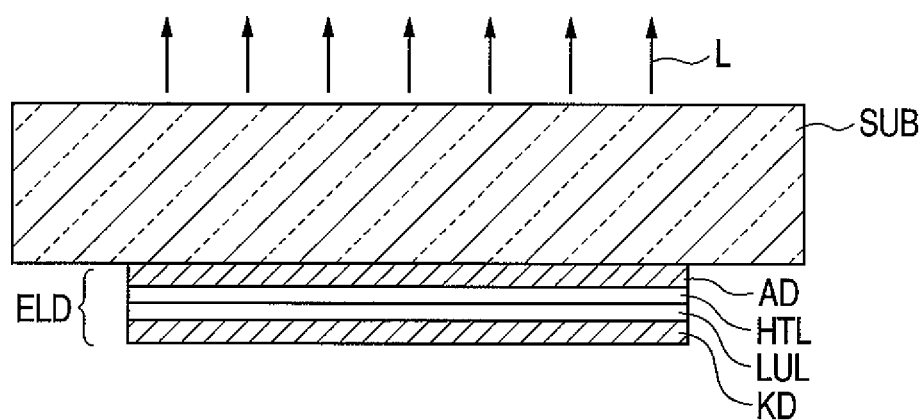
FIG. 7 An enlarged schematic cross section of a principal part of a structural example of an organic light emitting element.
Figure 8:
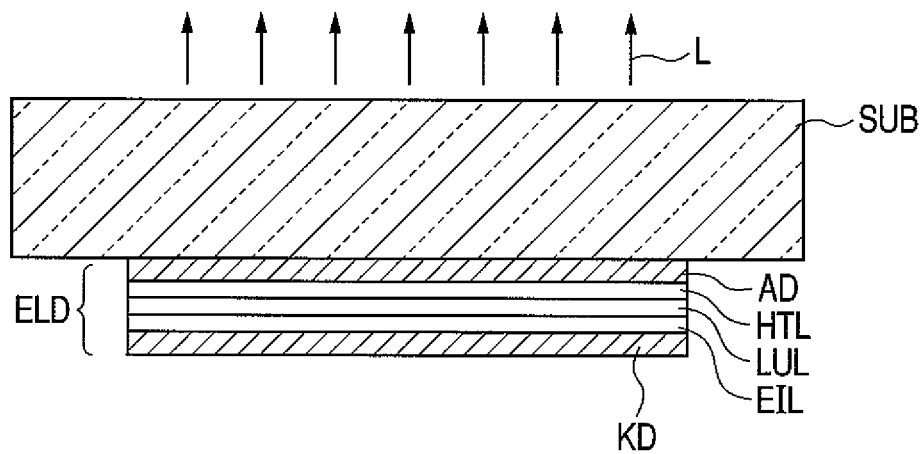
FIG. 8 An enlarged schematic cross section of a principal part of another structural example of an organic light emitting element.
Figure 9:
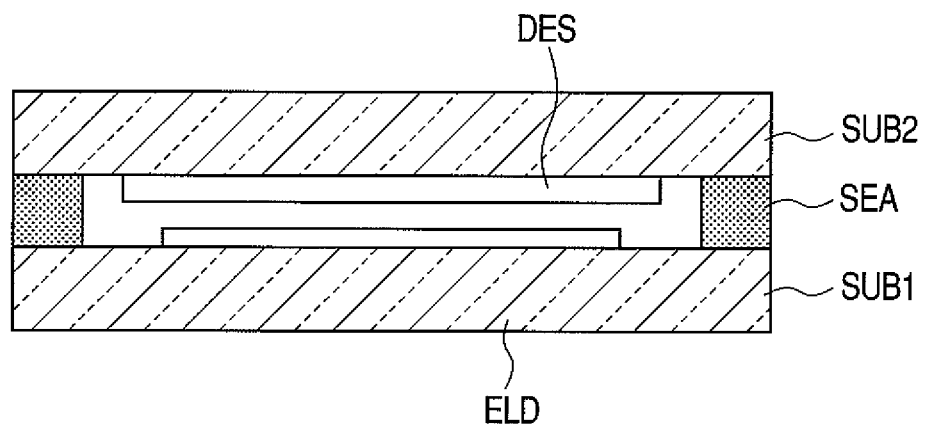
FIG. 9 A schematic cross section of a principal part of a structural example of a top emission organic EL display device.

SUB1, Sealing glass substrate; SUB2, Translucent glass substrate; ELD, Organic light emitting element; SEA, Sealing material; DES, Transparent drying material; FRM, Frame; UNE, Surface roughness; and POL, Polarizing film.

The invention claimed is:

1. An organic EL display device comprising:
a first substrate having an organic EL element on an inner surface thereof; and
a second substrate, which is a flat glass substrate, for hermetically sealing the organic EL element with a sealing material interposed between the first and second substrates at a peripheral portion of the second substrate,
wherein the second substrate has a transparent drying material on an inner surface thereof at a position inwardly from the sealing material,
wherein a display image is visible through the transparent drying material and the second substrate,
wherein within a bank-shaped frame which is separate from the second substrate and which is formed on the inner surface of the second substrate, the transparent drying material is formed by a dispenser and spread by a squeegee, and drying a solution within the bank-shaped frame formed on the inner surface of the second substrate,
wherein the transparent drying material is provided with varying thickness and with a surface having unevenness so that an angle formed by a normal line on the second substrate and a normal line at different positions on the surface having unevenness of the transparent drying material varies, and the variation of the angle at the different positions is greater than 0 degrees and no greater than 53 degrees so that distortion and disturbance including luminance nonuniformity of an image resulting from the surface unevenness of the transparent drying material are absorbed to enable obtaining of a sharp image, and
wherein at least one of a color filter, a color film and a polarizing film is arranged on the outer surface of the second substrate.

2. The organic EL display device according to claim 1, wherein the transparent drying material is alcoholate.

3. The organic EL display device according to claim 1, wherein the transparent drying material is silica gel.

4. The organic EL display device according to claim 2, wherein the transparent drying material is a transparent thin film formed such that a transparent drying material solution with a viscosity of 15 cp to 40 cp in which alcoholate is dissolved in a solvent is applied to an inner surface of the translucent substrate, spread in one direction and then dried.

5. The organic EL display device according to claim 3, wherein the transparent drying material is a transparent thin film formed such that a transparent drying material solution with a viscosity of 15 cp to 40 cp in which silica gel is dissolved in a solvent is applied to an inner surface of the second substrate, spread in one direction and then dried.

6. The organic EL display device according to claim 1, wherein the polarizing film is provided on the outer surface of the second substrate.

7. The organic EL display device according to claim 1, wherein a distance between the transparent drying material and the organic EL element is 0 to 40 μm.

8. The organic EL display device according to claim 7, wherein the transparent drying material is in partial or full contact with the organic EL element.

9. The organic EL display device according to claim 1, wherein the second substrate having the transparent drying material on the inner surface thereof and the at least one of the color filter, color film and polarizing film on the outer surface thereof is disposed opposite to the first substrate having the organic EL element on the inner surface thereof so as to substantially eliminate luminance nonuniformity caused by reflected light.

10. The organic EL display device according to claim 6, wherein the polarizing film arranged on the outer surface of the second substrate which is disposed opposite to the organic EL element on the inner surface of the first substrate enables substantial elimination of luminance nonuniformity caused by reflected light.

11. The organic EL display device according to claim 1, wherein the bank-shaped frame is formed on the inner surface of the second substrate inwardly from the sealing material, and the transparent drying material is formed on the inner surface of the second substrate within the area delimited by the bank-shaped frame.

12. The organic EL display device according to claim 11, wherein the bank-shaped frame is formed of a resin material.

13. The organic EL display device according to claim 1, wherein the transparent drying material is formed within an opening of the bank-shaped frame formed on the inner surface of the second substrate and facing the first and second substrates, the bank-shaped frame being a member separate from the sealing material and disposed within an area sealed by the sealing material without overlapping the sealing material.

14. The organic EL display device according to claim 1, wherein the second substrate is a flat glass substrate of substantially constant thickness throughout, and the transparent drying material is formed by coating and drying a solution only disposed within the bank-shaped frame formed on the inner surface of the second substrate.

15. The organic EL display device according to claim 1, wherein the variation of the angle of greater than 0 degrees and no greater than 53 degrees at the different positions on the surface having unevenness of the transparent drying material enable a reflectivity of the organic EL display device of no greater than 10%, wherein the reflectivity is the amount in which light incident from the first glass substrate is again reflected by the first glass substrate.

16. The organic EL display device according to claim 1, wherein the varying thickness of the transparent drying material varies within a range of 10 µm as a minimum thickness to 35 µm as a maximum thickness.

* * * * *